(12) United States Patent
Gaied et al.

(10) Patent No.: US 9,390,861 B2
(45) Date of Patent: Jul. 12, 2016

(54) CAPACITANCE BANK SYSTEMS AND METHODS

(71) Applicant: Intel Mobile Communictions GmbH, Neubiberg (DE)

(72) Inventors: David Gaied, Cairo (EG); Ahmed Nader Mohieldin, Giza (EG)

(73) Assignee: Intel Deutschland GmbH, Neubiberg (DE)

( * ) Notice: Subject to any disclaimer, the term of this patent is extended or adjusted under 35 U.S.C. 154(b) by 721 days.

(21) Appl. No.: 13/752,624

(22) Filed: Jan. 29, 2013

(65) Prior Publication Data

US 2014/0210278 A1 Jul. 31, 2014

(51) Int. Cl.
| | |
|---|---|
| *H01G 4/38* | (2006.01) |
| *H03B 5/02* | (2006.01) |
| *H03J 3/20* | (2006.01) |
| *H03J 5/24* | (2006.01) |

(52) U.S. Cl.
CPC .. *H01G 4/38* (2013.01); *H03B 5/02* (2013.01); *H03J 3/20* (2013.01); *H03J 5/246* (2013.01); *H03B 2200/005* (2013.01); *H03J 2200/10* (2013.01)

(58) Field of Classification Search
CPC ............ H01L 28/40; H01G 4/38; H01G 4/40; H01G 7/00; H01G 7/06; H03H 21/007; H03H 2210/025; H03J 2200/39; H03J 5/246; H03J 3/20; H03J 2200/10; H03B 5/02; H03B 2200/005

USPC ................... 307/109, 110; 361/281
See application file for complete search history.

(56) References Cited

U.S. PATENT DOCUMENTS

| | | | |
|---|---|---|---|
| 4,878,151 A | 10/1989 | Gallichio | |
| 6,462,685 B1* | 10/2002 | Korkala | H03M 3/334 341/131 |
| 7,566,994 B2 | 7/2009 | Medi et al. | |
| 7,855,610 B2 | 12/2010 | Taghivand et al. | |
| 2005/0184812 A1* | 8/2005 | Cho | H03B 5/1215 331/36 C |
| 2006/0244519 A1 | 11/2006 | Kocaman et al. | |
| 2009/0160263 A1* | 6/2009 | Spears | H01G 7/06 307/109 |
| 2009/0322436 A1* | 12/2009 | Hosoya | H03L 7/099 331/117 FE |
| 2010/0090760 A1* | 4/2010 | Bachmann | H01L 29/93 327/586 |
| 2011/0002080 A1* | 1/2011 | Ranta | H03M 1/1061 361/277 |
| 2012/0211868 A1* | 8/2012 | Stribley | H01G 4/08 257/532 |

* cited by examiner

*Primary Examiner* — Rexford Barnie
*Assistant Examiner* — Terrence Willoughby
(74) *Attorney, Agent, or Firm* — Eschweiler & Associates, LLC

(57) ABSTRACT

A capacitance bank system includes a plurality of voltage controlled capacitance cells and an output node. The plurality of capacitance cells have an anti-parallel configuration. The plurality of capacitance cells are configured to selectively provide cell capacitances. The output node is coupled to the plurality of capacitance cells. The output node is configured to provide an input capacitance step smaller than a minimum physical capacitor supported by a particular technology.

22 Claims, 6 Drawing Sheets

CAPACITANCE BANK SYSTEMS AND METHODS

BACKGROUND

Oscillators are types of electronic circuits that generate repetitive, oscillating signals. Oscillators are used in a variety of electronic devices for a wide range of uses including timing, clock signals, communication signals, modulation signals, and the like.

Generally, oscillator circuits are designed to provide a specific signal at a selected frequency. The type of signal depends on the device using it. The selected frequency can be static or can vary over time, also depending on the device using the oscillation signal.

DETAILED DESCRIPTION

Figure 1:
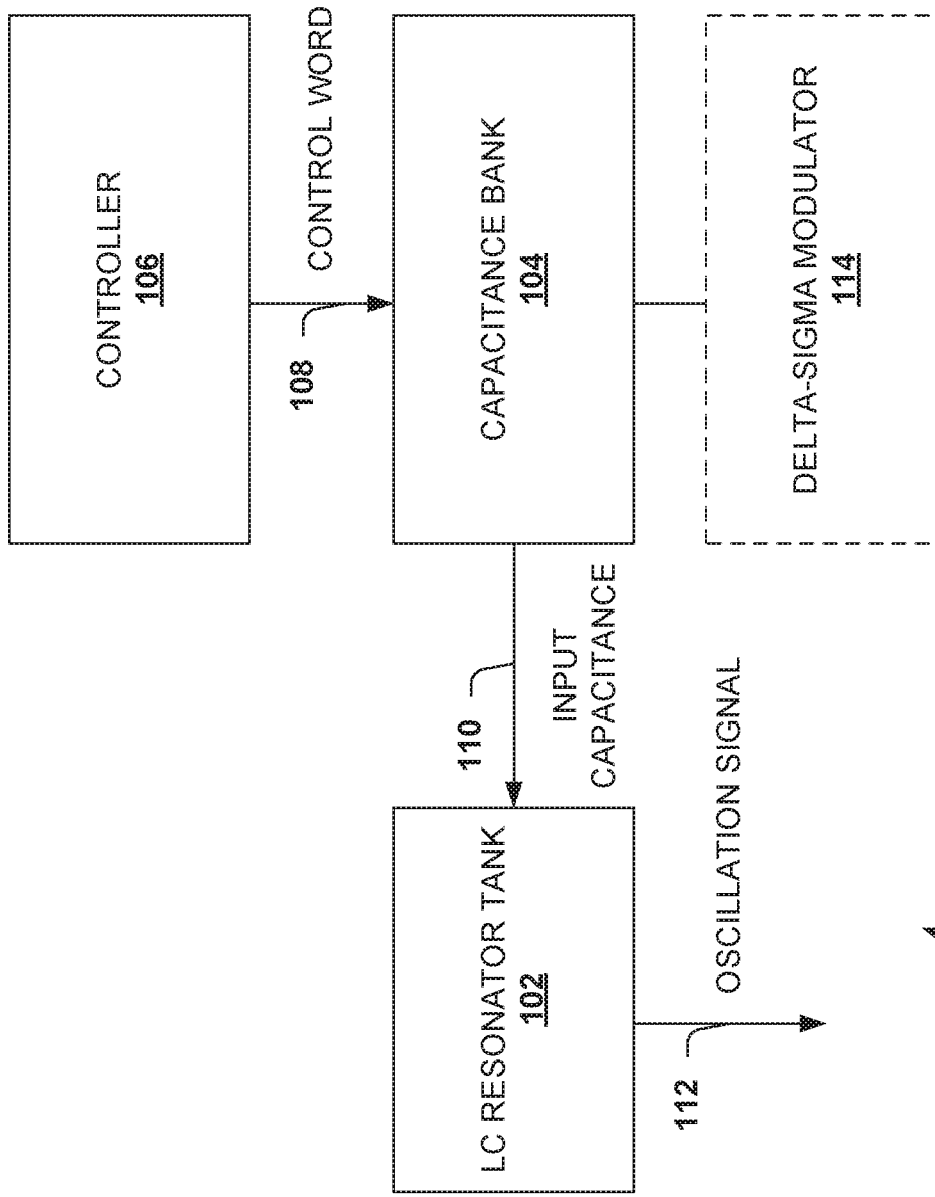
FIG. 1 is a block diagram illustrating an oscillation system utilizing a capacitance bank with a relatively small capacitance step.

The present invention will now be described with reference to the attached drawing figures, wherein like reference numerals are used to refer to like elements throughout, and wherein the illustrated structures and devices are not necessarily drawn to scale.

Systems and methods are disclosed that provide a capacitance step smaller than a minimum physical capacitor supported by a particular technology.

The frequency resolution for a device or circuit is related to the capacitance resolution or step of a utilized capacitance bank. A higher or greater frequency resolution may be required for some applications. Thus, a corresponding higher capacitance resolution or smaller capacitance step size may likewise be required.

The capacitance step for capacitance or capacitor banks is typically a smallest or minimum sized capacitor in the capacitance bank in a given technology. Thus, the step size is limited by the size of available capacitors. As a result, the frequency resolution for circuits utilizing such a capacitance bank is also limited by the size of available capacitors.

FIG. 1 is a block diagram illustrating an oscillation system 100 utilizing a capacitance bank with a relatively small capacitance step. The system 100 can be utilized to generate an oscillation signal, such as one used for clock signals, communication devices, and the like. The system 100 utilizes a relatively small capacitance step for yielding a selected frequency for the oscillation signal.

The system 100 includes an LC resonator tank 102, a capacitance bank 104, and a controller 106. The resonator tank 102 is used to generate an oscillation signal 112 as an output signal at a selected frequency. The frequency of the oscillation signal is specified by an input capacitance 110. The frequency can vary as the input capacitance 110 is varied. A smallest amount of frequency variation for the oscillation signal 112 is referred to as the frequency step.

The capacitance bank 104 provides a capacitance value that varies by a capacitance step. This variation is the smallest change in capacitance that the capacitance bank 104 can provide. The frequency step size is a function of the capacitance step size. Thus, the smaller the capacitance step, the smaller the frequency step.

The capacitance bank 104 selectively provides the input capacitance 110 to the resonator tank 102. The input capacitance 110 is provided according to a control word 108. The control word 103 selects states for one or more capacitance cells within the capacitance bank. The selected states result in a selected capacitance and capacitance step for the input capacitance 110.

The capacitance bank 104 includes the one or more capacitance cells having varying capacitance values. Examples of suitable capacitance cells are provided below. Each cell operates with an OFF state and an ON state. The cell OFF state provides a first capacitance. The cell ON state provides a second capacitance equal to the first capacitance plus a cell difference amount. The cell difference amount is based on an integer coefficient multiplied by a base capacitance difference amount. The integer coefficient ranges from 1 to N. The base capacitance difference amount correlates to the capacitance step for the bank 104. The capacitance step is smaller than a smallest capacitance size of capacitors within the capacitance cells.

The controller 106 selects a frequency and/or frequency change by setting the control word 108 to a particular value. The control word 108, in one example, has a plurality of control bits, where each control bit turns a capacitance cell of the capacitance bank 104 ON or OFF. The number of bits utilized for the control word 108 can vary. In one example, the control word 108 is an 8 bit word leading integer coefficients ranging from 1 to 128.

It is appreciated that a variation of the system 100 can utilize a sigma delta modulator 114 to dither the capacitor bank to have a finer step. This could be accomplished by switching the capacitor bank at a higher rate than needed to perform oversampling. Thus, the capacitance bank 104 can be combined with a sigma delta modulator to control or adjust the capacitance step and frequency.

Figure 2:
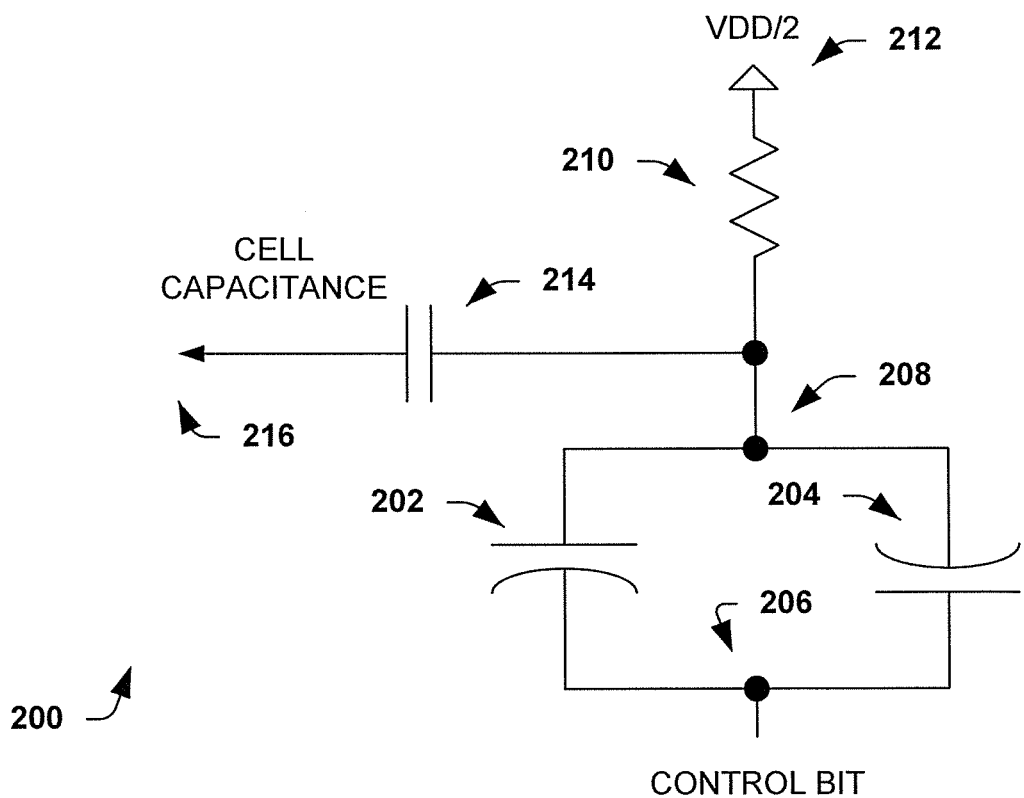
FIG. 2 is a diagram of a capacitance cell that can be utilized in a capacitance bank.

FIG. 2 is a diagram of a capacitance cell 200 that can be utilized in a capacitance bank. For example, the cell 200 can be used in the capacitance bank 104 described above. The capacitance cell 200 provides a capacitance step smaller than capacitors used within the cell by using two voltage-controlled capacitors, such as MOS capacitors, connected anti-parallel or back to back with one capacitor slightly larger than the other.

The capacitance cell 200 includes a first capacitor 202, a second capacitor 204, a control node 206, a mid node 208, a coupling resistor 210, a divided supply voltage 212, a coupling capacitor 214, and an output node 216. The coupling capacitor 214 couples the mid node 208 to the output node 216. The coupling resistor 210 connects the mid node 208 to the divided voltage supply 212.

The first and second capacitors 202 and 204 are voltage controlled capacitors. The first capacitor 202 is coupled to the second capacitor 204 back to back or anti-parallel. Thus, a positive end of the first capacitor 202 is coupled to the mid node and a negative end of the first capacitor 202 is coupled to the control node. A negative end of the second capacitor 204 is coupled to the mid node and a positive end of the second capacitor 204 is connected to the control node. As a result, the positive end of the first capacitor 202 is coupled to the negative end of the second capacitor 204 and the negative end of the first capacitor 202 is coupled to the positive end of the second capacitor 204. The first capacitor 202 and the second capacitor 204 are connected back to back or anti-parallel.

The first capacitor 202 has a first capacitance. Typically, the first capacitor 202 is selected to have a relatively small capacitance value. In one example, the first capacitor 202 has a smallest capacitance value for a type of capacitor. The second capacitor 204 has a second capacitance, which is larger than the first capacitance. Generally, the second capacitance is slightly larger than the first capacitance. This amount of difference is referred to as the cell difference amount. Thus, the second capacitance can be described as being equal to the first capacitance plus the cell difference amount. The cell difference amount is based on an integer coefficient multiplied by a base capacitance difference amount. The integer coefficient ranges from 1 to N. The capacitance step, also the base capacitance difference amount, is typically smaller than the first capacitance of the first capacitor 202.

The control node 206 receives a control bit, which corresponds to a state. In one example, the control bit corresponds to an OFF state and an ON state. In the OFF state, the control bit results in a 0 or ground connection. In the ON state, the control bit results in a supply voltage VDD being coupled to the control node 206. The supply voltage being greater than the divided supply voltage 212.

The output node 216 provides a cell capacitance that depends ON the control bit. In one example, the cell capacitance is a portion of an input capacitance provided by a capacitance bank of which cell 200 is a part of. The anti-parallel configuration results in a portion of the cell capacitance being equal to the first capacitance in one state and being equal to the second capacitance in another state. Additional details of the operations of the states are provided below.

It is appreciated that variations of the cell 200 are contemplated and that specific states and supply voltages are provided to facilitate understanding.

Figure 3:
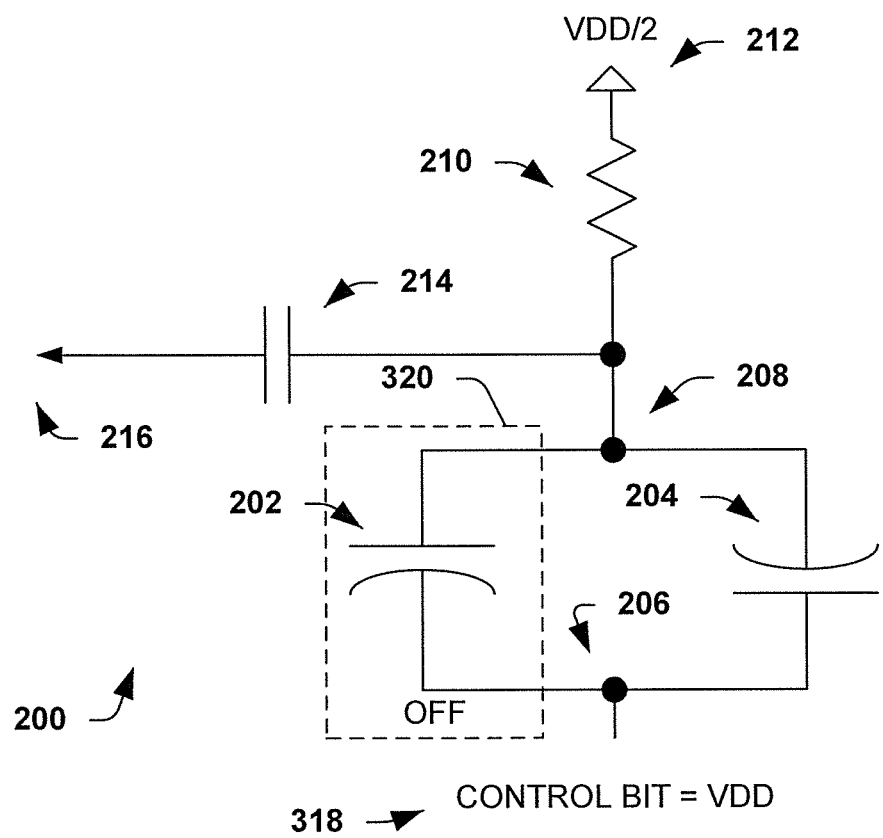
FIG. 3 is a schematic diagram illustrating the capacitance cell with a control bit set to an ON state.
Figure 4:
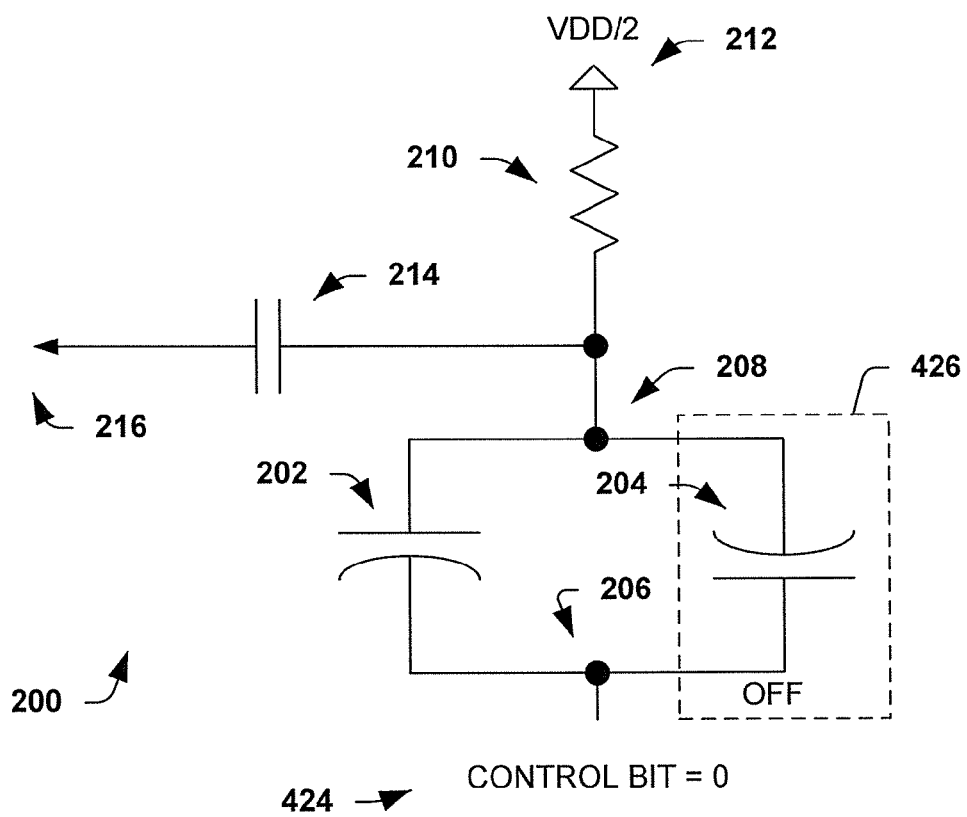
FIG. 4 is a schematic diagram illustrating the capacitance cell with a control bit set to an OFF state.

FIGS. 3 and 4 illustrate an example operation of the capacitance cell 200 for varied states. The figures illustrate an ON state and an OFF state to aid understanding. However, it is appreciated that the capacitance cell 200 and variations thereof can utilize other states besides those described below.

FIG. 3 is a schematic diagram illustrating the capacitance cell 200 with a control bit set to an ON state. The components of the cell 200 are described in further detail above. In this example, the control bit set to ON results in an ON voltage 318 being applied to the control node 206.

In this example, the ON voltage 318 is set to be the supply voltage. Thus, a lower side of the capacitor configuration, at the control node 206 is connected to the supply voltage. The capacitor configuration includes the first and second capacitors 202 and 204, the control node 206, and the mid node 208. An upper side of the configuration, at the mid node 208, is connected to the divided supply 212 via the coupling resistor 210. Thus, the control node 206 is at a higher potential than the mid node 208.

The first capacitor 202 is oriented with its negative end connected to the relatively higher control node 206. Thus the first capacitor 202 is turned OFF 320 and it is essentially removed from the cell 200. The first capacitor 202 and its first capacitance do not contribute to the cell capacitance provided at the output node 216.

The second capacitor 204 is oriented with its positive end connected to the relatively higher control node 206 and its negative end connected to the relatively lower mid node 208. As a result, its positive end is at a higher potential than its negative. The second capacitor is turned ON and is part of the configuration. The second capacitor 204 and its second capacitance contribute to the cell capacitance provided at the output node 216.

FIG. 4 is a schematic diagram illustrating the capacitance cell 200 with a control bit set to an OFF state. In this example, the control bit set to OFF results in an OFF voltage 424 being applied to the control node 206.

In this example, the OFF is set to be 0 volts or ground. The lower side of the capacitor configuration, at the control node 206 is connected to ground. The upper side of the configuration, at the mid node 208, is connected to the divided supply 212 via the coupling resistor 210. Thus, the control node 206 is at a lower potential than the mid node 208.

The first capacitor 202 is oriented with its negative end connected to the relatively lower control node 206. Thus, the first capacitor 202 is turned ON. The first capacitor 202 and its first capacitance fully contribute to the cell capacitance provided at the output node 216.

The second capacitor 204 is oriented with its positive end connected to the relatively lower control node 206 and its negative end connected to the relatively higher mid node 208. As a result, its positive end is at a lower potential than its negative end. The second capacitor is turned OFF and does not contribute to the cell capacitance provided at the output node 216.

Figure 5:
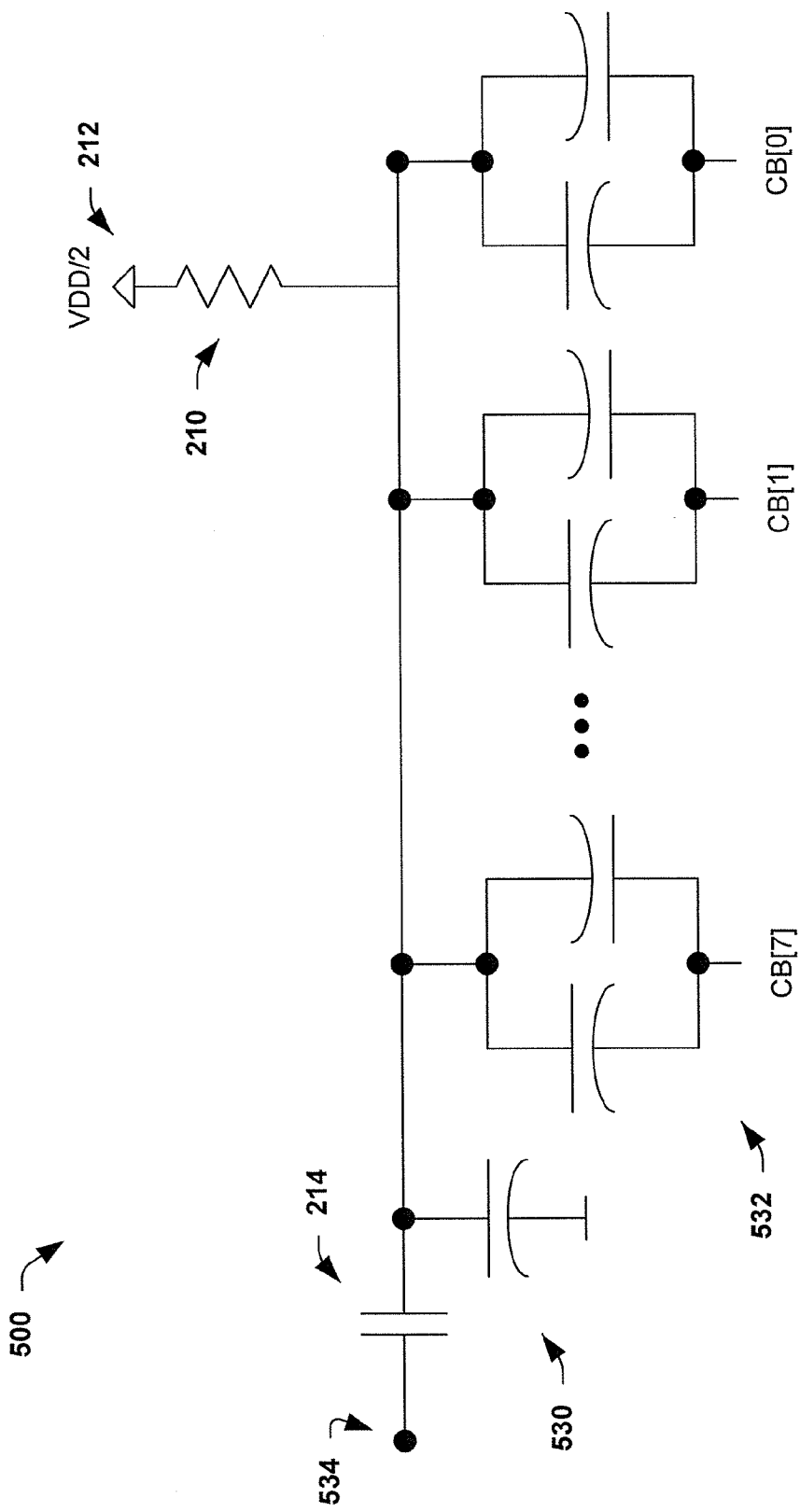
FIG. 5 is a diagram of a capacitance bank that provides an input capacitance with a relatively small capacitance step.

FIG. 5 is a diagram of a capacitance bank 500 that provides an input capacitance with a relatively small capacitance step. The capacitance bank 500 includes capacitance cells the yield capacitance step values smaller than the capacitors used within the cells.

The capacitance bank 500 includes an output node 534, a coupling capacitor 214, a coupling resistor 210, a divided supply voltage 212, a fixed capacitor 530 and a plurality of capacitance cells 532. The capacitance bank 50 provides an input capacitance at the output node 534 according to a digital control word. The input capacitance selectively varies and has a capacitance step as described above.

The coupling resistor 210 is connected to a divided supply voltage 212 and to the capacitance cells 532. The coupling capacitor 214 is connected to the output node 534 and the capacitance cells 532. The coupling resistor 210 and the coupling capacitor 214 perform AC coupling to mitigate DC bias and the like.

The fixed capacitor 530 is connected between the capacitance cells 532 and ground. The fixed capacitor 530 further reduces the capacitance step of the input capacitance. Furthermore, the fixed capacitor 530 can improve a quality factor of the capacitance bank 500.

Each of the capacitance cells 532 operates substantially similar to the cell 200 described above. The cells 532 operate according to the digital control word, which controls states for the cells 532. Thus, the digital control word assigns each cell to one of a plurality of states.

The capacitance cells 532 include a plurality of capacitors connected back to back or in an anti-parallel fashion. For illustrative purposes, the cells 532 are shown and described with first and second capacitors. However, it is appreciated that additional capacitors can be utilized within the cells 532.

In this example, the capacitance cells 532 each include a first capacitor and a second capacitor. The first capacitor has a first capacitance and the second capacitor has a second capacitance. Each operates with an OFF state and an ON state, in this example. The cell OFF state provides the first capacitance. The cell ON state provides the second capacitance equal to the first capacitance plus a cell difference amount. The cell difference amount is based ON an integer coefficient multiplied by a base or minimum capacitance difference amount. The integer coefficient ranges from 1 to N. The base capacitance difference amount is related to the capacitance step for the bank 500. The capacitance step is smaller than the first capacitance.

For this example, the number of bits in the control word and the capacitance bank is 8, thus M=8 and the multiplication coefficient N=2^(M−1). However, other suitable values can be utilized. The control word is denoted by control bits CB[0], CB[1], . . . CB [M−1]. The least significant control bit is CB[0].

The coupling capacitor 214 has a capacitance value denoted by $C_C$. The fixed capacitor 530 has a capacitance value denoted by $C_{ft}$. The first capacitance is denoted by $C_1$.

The base difference amount is denoted by $\Delta C$. The second capacitance, which is a combination of the first capacitance and the base capacitance difference amount is given by:

$$C_1 + N\Delta C \quad (1)$$

The input capacitance is given by:

$$C_{in} = \frac{C_C \cdot (C_{ft} + L\Delta C)}{C_C + C_{ft} + L\Delta C} \quad (2)$$

Where, $$L = CB[0] + CB[1] \times 2 + CB[2] \times 2^2 + \ldots + CB[M-1] \times 2^{M-1} \quad (3)$$

And the capacitance step is given by:

$$C_{step} = \frac{\partial C_{in}}{\partial L} = \frac{C_C^2 \Delta C}{(C_C + C_{ft} + L\Delta C)^2}$$

Where:

$$C_{ft} = C_f + L_{bits} \times C_1 \quad (4)$$

Where, $$L_{bits} = 2^M - 1. \quad (5)$$

It can be seen that the capacitance step is necessarily less than the first capacitance. Further, if the first capacitor is a minimum sized capacitor for a given technology, such as MOS, the step size is necessarily less than the minimum sized capacitor.

In one example, a minimum available capacitor size is 4.067 fF. Using an anti-parallel capacitance configuration as described above with two capacitors having capacitances of 4.067 fF and 4.99 fF result in a difference amount of 0.9 fF. A fixed capacitor having a value of 4.25 pF and a coupling capacitor of 800 fF is used. In this example, a capacitance step can range from 11.5 aF to 19.5 aF, which is substantially less than the minimal available capacitor size. These example values are provided for illustrative purposes only. It is appreciated that other values can be utilized.

Figure 6:
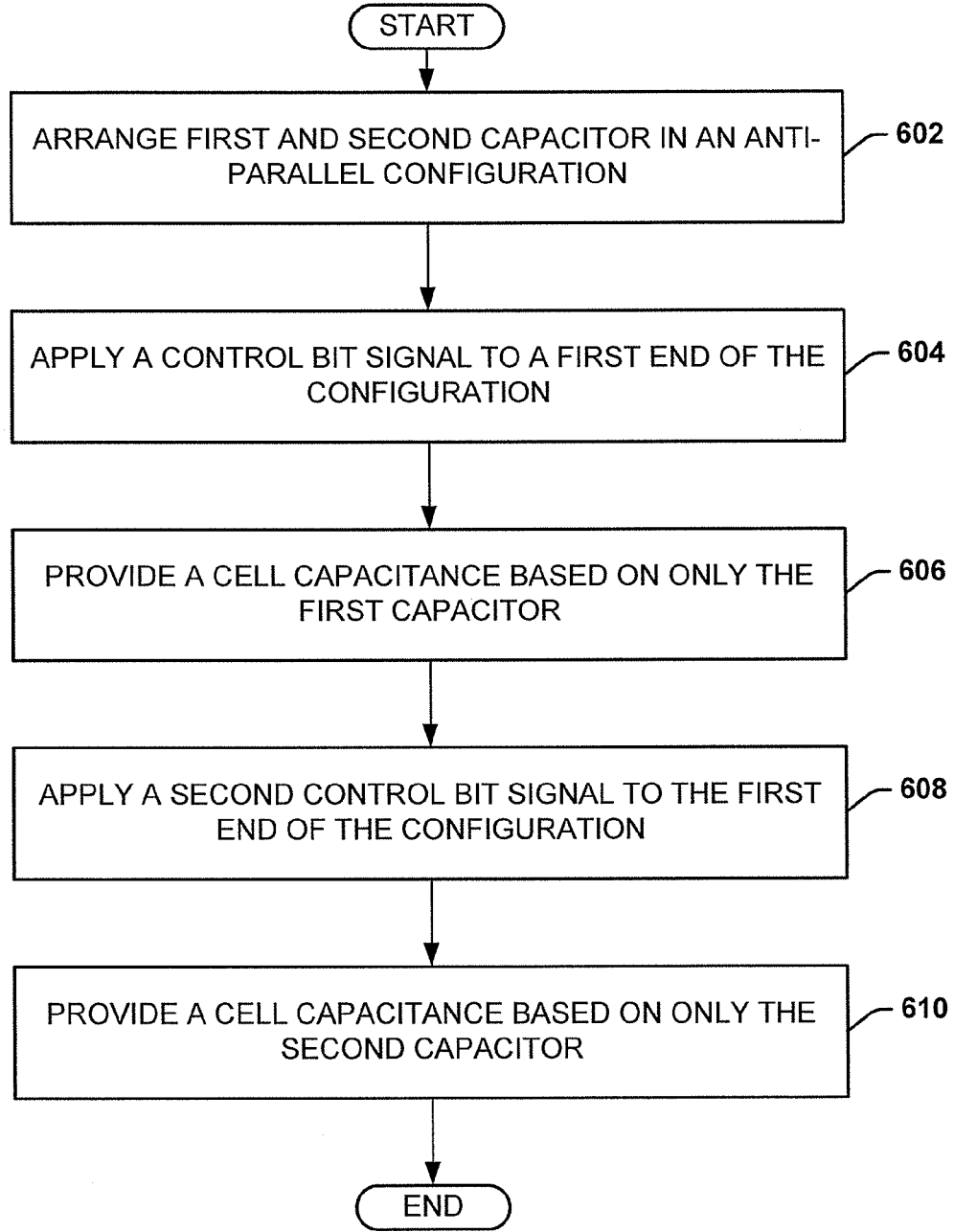
FIG. 6 is a flow diagram illustrating a method of providing or generating an input capacitance.

FIG. 6 is a flow diagram illustrating a method 600 of providing or generating an input capacitance. The input capacitance can then be utilized for a suitable purpose, such as selecting an oscillation frequency.

The method 600 begins at block 602, where a first capacitor and a second capacitor are arranged in an anti-parallel capacitance configuration. The first capacitor and the second capacitor are voltage controlled capacitors, such as MOS capacitors. They are connected back to back as shown above in FIG. 2 and elsewhere. A positive end of the first capacitor is connected to a negative end of the second capacitor and a negative end of the first capacitor is connected to a positive end of the second capacitor.

The first capacitor has a first capacitance and the second capacitor has a second capacitance. One of the capacitances is slightly larger than the other such that there is a difference amount or base difference amount between them. The difference amount can be multiplied by an integer coefficient having a value from 1 to N, where N is based on a control word length. In one example, the coefficients have values of 1, 2, 4, 8, 16, 32, 64, and 128. Equations (1) to (5) above describe suitable ways to determine and assign capacitance values and the integer coefficients.

A control bit signal is applied to a first end of the capacitance configuration at block 604. The control bit signal, in one example, is a supply voltage or a ground connection. The first end is merely a connection point between the first capacitor and the second capacitor. For example, the first end can be a node or connection point to a positive end of the first capacitor and a negative end of the second capacitor. The applied control bit signal corresponds to a first state.

A cell capacitance based on only the first capacitor is provided at block 606. The cell capacitance is provided at a second end of the configuration. The first state results in a more positive voltage or higher voltage being applied to the positive end of the first capacitor. As a result, the second capacitor is effectively removed from the cell and does not contribute to the output capacitance. The control bit signal is applied with a higher or lower voltage than that present at the second end of the configuration such that the positive voltage is applied across the first capacitor. Generally, the second end is at a divided supply voltage to facilitate selection.

A second control bit signal is applied to the first end of the capacitance configuration at block 608. The second control signal can be a supply voltage or a ground connection. In this example, the second control signal is opposite the control signal applied in block 604. The second control bit signal corresponds to a second state.

The cell capacitance is provided at block 610 according to only the second capacitor. The cell capacitance is provided at the second end of the capacitance configuration as only the second capacitor, which corresponds to the second state. The second state results in a more positive voltage or higher voltage being applied to the positive end of the second capacitor. As a result, the first capacitor is essentially removed from the cell and does not contribute to the output capacitance. The second control bit signal is applied with a higher or lower voltage than that present at the second end of the configuration such that the positive voltage is applied across the second capacitor.

As a result, the method 600 can provide input capacitances for different states that vary by a difference amount. Thus, a smaller capacitance step and higher frequency resolution can be obtained. Conventional methods are typically limited by a physical capacitor and have a capacitance step being the size of the capacitor employed.

Further, the method 600 can be repeated and controlled to operate the cell in one state, two states, or more states, where each state yields a different cell capacitance.

The method 600 is described in terms of a single capacitance cell, however it is appreciated that it can be employed for a plurality of capacitances cells. Additionally, it is appreciated that the method 600 can be utilized for a variety of uses including a capacitance bank, communication systems and the like.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

A capacitance bank system includes a plurality of capacitance cells and an output node. The plurality of capacitance cells have an anti-parallel configuration. The plurality of capacitance cells are configured to selectively provide cell capacitances. The output node is coupled to the plurality of capacitance cells. The output node is configured to provide an input capacitance.

A capacitance cell includes a first capacitor and a second capacitor. The first capacitor has a positive end coupled to a mid node and a negative end coupled to a control node. The first capacitor has a first capacitance. The second capacitor has a positive end coupled to the control node and a negative end coupled to the mid node. The first capacitance is provided at the mid node in a first state and the second capacitance is provided at the mid node in a second state.

A method of using a capacitance cell is disclosed. A first capacitor and a second capacitor are configured in an anti-parallel capacitance configuration. A control bit signal corresponding to a first state is applied to a first end of the capacitance configuration. A cell capacitance based on only the first capacitor is provided at a second end of the capacitance configuration.

Although the invention has been illustrated and described with respect to one or more implementations, alterations and/or modifications may be made to the illustrated examples without departing from the spirit and scope of the appended claims. For example, although the transmission circuit described herein has been illustrated as a transmitter circuit, one of ordinary skill in the art will appreciate that the invention provided herein may be applied to transceiver circuits as well. Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A capacitance bank system comprising:
a plurality of voltage controlled capacitance cells having an anti-parallel configuration and configured to selectively provide cell capacitances;
an output node coupled to the plurality of capacitance cells via a coupling capacitor, wherein the output node is configured to provide an input capacitance; and
a fixed capacitor coupled to the plurality of capacitance cells, the fixed capacitor configured to decrease a capacitance step of the system, wherein the capacitance step is a function of a capacitance of the coupling capacitor, a capacitance of the plurality of coupling capacitors, and a capacitance of the fixed capacitor.

2. The system of claim 1, wherein the capacitance step is less than a smallest capacitance used within the capacitance bank system.

3. The system of claim 1, wherein at least one of the capacitance cells is configured having a first capacitor and a second capacitor connected back to back, wherein the first capacitor has a first capacitance and the second capacitor has a second capacitance greater than the first capacitance.

4. The system of claim 3, wherein the second capacitance is equal to the first capacitance plus a difference amount, wherein the difference amount is less than the first capacitance.

5. The system of claim 4, wherein the difference amount is an integer multiple of a base difference amount.

6. The system of claim 5, wherein the capacitance step is a function of the base difference amount.

7. The system of claim 6, wherein the capacitance step is given by $$C_{step} = \frac{C_C^2 \Delta C}{(C_C + C_{ft} + L\Delta C)^2},$$

where $C_{step}$ is the capacitance step, $C_C$ is the capacitance of the coupling capacitor, $\Delta C$ is the base difference amount, L is an integer selectable via a code word, and $C_{ft}$ is a function of the capacitance of the fixed capacitor.

8. The system of claim 1, wherein the capacitance cells are configured to receive control bits.

9. The system of claim 8, wherein the capacitance cells are configured to provide a first capacitance or a second capacitance according to the control bits.

10. The system of claim 8, wherein the control bits correspond to a frequency selection and a frequency step.

11. The system of claim 1, further comprising a coupling capacitor coupled between the output node and the plurality of capacitance cells.

12. The system of claim 1, further comprising a resonator tank coupled to the output node.

13. The system of claim 12, wherein the resonator tank is configured to generate a selected frequency having a frequency step according to the anti-parallel configuration of the plurality of capacitance cells.

14. The system of claim 1, further comprising a sigma delta modulator coupled to the capacitance bank, wherein the sigma delta modulator is configured to further reduce a capacitance step of the system.

15. A capacitance cell comprising:
   a first capacitor having a positive end coupled to a mid node and a negative end coupled to a control node, wherein the first capacitor has a first capacitance;
   a second capacitor having a positive end coupled to the control node and a negative end coupled to the mid node, wherein the second capacitor has a second capacitance;
   a coupling capacitor coupled between the mid node and an output node; and
   a fixed capacitor coupled to the mid node, the fixed capacitor configured to decrease a capacitance step of the capacitance cell, wherein the capacitance step is a function of a capacitance of the coupling capacitor and a capacitance of the fixed capacitor;
   wherein the first capacitance is provided at the mid node in a first state and the second capacitance is provided at the mid node in a second state.

16. The cell of claim 15, wherein the mid node receives a divided supply voltage and the control node receives one of a ground and a non-divided supply voltage.

17. The cell of claim 15, wherein the first capacitance is greater than the second capacitance by a difference amount multiplied by an integer coefficient.

18. The cell of claim 15, wherein the second capacitance is greater than the first capacitance by a difference amount.

19. The cell of claim 18, wherein the first capacitance can be a physical limit and the difference amount is smaller than the physical limit.

20. The cell of claim 15, wherein the first capacitor and the second capacitor are voltage controlled MOS capacitors.

21. A method of using a capacitance cell, the method comprising:
   configuring a first capacitor and a second capacitor in an anti-parallel capacitance configuration, wherein the first capacitor and the second capacitor are coupled via a mid node to a coupling capacitor and a fixed capacitor configured to decrease a capacitance step of the system, wherein the capacitance step is a function of a capacitance of the coupling capacitor and a capacitance of the fixed capacitor;
   applying a control bit signal corresponding to a first state to a first end of the capacitance configuration; and
   providing a cell capacitance based on only the first capacitor at a second end of the capacitance configuration.

22. The method of claim 21, further comprising applying a second control bit signal corresponding to a second state to the first end of the capacitance configuration and providing the cell capacitance based on only the second capacitor at the second end of the capacitance configuration.

* * * * *